(12) United States Patent
Ankireddi et al.

(10) Patent No.: US 8,331,094 B2
(45) Date of Patent: Dec. 11, 2012

(54) THERMAL AND POWER BUS STACKED PACKAGE ARCHITECTURE

(75) Inventors: Seshasayee Ankireddi, San Jose, CA (US); Vadim Gektin, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 193 days.

(21) Appl. No.: 13/012,078

(22) Filed: Jan. 24, 2011

(65) Prior Publication Data
US 2012/0188708 A1 Jul. 26, 2012

(51) Int. Cl.
*H05K 7/20* (2006.01)
*F28F 7/00* (2006.01)
*H01L 23/48* (2006.01)

(52) U.S. Cl. ...... 361/721; 165/80.2; 165/185; 257/713; 257/777; 257/786; 361/704; 361/699; 361/700

(58) Field of Classification Search .................. None
See application file for complete search history.

(56) References Cited

U.S. PATENT DOCUMENTS

| | | | | | |
|---|---|---|---|---|---|
| 4,103,318 | A | * | 7/1978 | Schwede | 361/707 |
| 5,016,138 | A | * | 5/1991 | Woodman | 361/688 |
| 5,229,960 | A | * | 7/1993 | De Givry | 365/63 |
| 5,377,077 | A | * | 12/1994 | Burns | 361/704 |
| 5,963,794 | A | * | 10/1999 | Fogal et al. | 438/108 |
| 6,051,886 | A | * | 4/2000 | Fogal et al. | 257/777 |
| 6,884,657 | B1 | * | 4/2005 | Fogal et al. | 438/109 |
| 6,930,378 | B1 | * | 8/2005 | St. Amand et al. | 257/686 |
| 7,459,776 | B1 | * | 12/2008 | St. Amand et al. | 257/686 |
| 2009/0080158 | A1 | * | 3/2009 | Conn | 361/699 |

* cited by examiner

*Primary Examiner* — Gregory Thompson
(74) *Attorney, Agent, or Firm* — Marsh Fischmann & Breyfogle, LLP; Per Larson; Kent A. Lembke

(57) ABSTRACT

A stacked microprocessor package architecture includes one or more microprocessor packages, the microprocessor packages including one or more microprocessor die disposed on a substrate, a satellite die, a thermal bus thermally coupled to the microprocessor die and thermally connected to system cooling, and a power bus providing power to the microprocessor die and coupled to system power. The microprocessor packages may include a module cap providing mechanical protection and/or thermal isolation or a thermal cooling path for stacked modules. Variable height standoffs provide signal connection from substrates of the stacked microprocessor packages to a system board.

20 Claims, 6 Drawing Sheets

THERMAL AND POWER BUS STACKED PACKAGE ARCHITECTURE

BACKGROUND OF THE INVENTION

1. Field of the Invention

The present invention generally relates to packaging of electronic systems with microprocessors including central processing units (CPUs), and in particular to electronic systems integrating multiple microprocessors and auxiliary devices.

2. Relevant Background

Microprocessor systems are becoming more complex and facing increasing information processing requirements. To increase microprocessor system speed and throughput using parallel processing, manufacturers are designing microprocessor systems using multiple central processing unit ("CPU") cores. Microprocessor systems may integrate multiple CPU cores a variety of ways. Commonly, each CPU core may be on a separate microprocessor die, and multiple microprocessor die are packaged together in one microprocessor system. Increasingly, more than one CPU core may be integrated on each microprocessor die.

Each microprocessor die requires auxiliary logic and circuits including system memory and/or cache memory. While some designs integrate CPU cores and memory on a single microprocessor die, some designs require more memory than is commonly placed on the same die as a CPU core. In these designs, a separate static random access memory (SRAM) die or dynamic random access memory (DRAM) die is packaged proximate to the microprocessor die.

To maximize system speed and density, system designers strive to place microprocessor die as physically proximal to one another and memory die as possible. However, increasing system density by placing microprocessor die in close physical proximity presents difficult technical challenges including providing adequate clean power to the microprocessor die and removing waste heat generated by the microprocessor and memory die.

SUMMARY

Multiple microprocessor packages are stacked together according to various embodiments of the invention. Each package has a substrate with microprocessor die and/or other die. Each package has a power bus that delivers the current needed for the operation of the die in the package and a thermal bus for efficient heat removal from high-power die in the package. If warranted, satellite die can be assembled onto each package substrate. The packages are placed in a rotated configuration so that each package can interface with the rest of the microprocessor system.

According to one aspect consistent with various embodiments a primary die is attached to a package substrate using standard flip-chip bonding techniques such as C4 bumps. The primary die may be a microprocessor die. A power bus for providing current to the primary die is attached to the substrate. A thermal bus is attached to the backside of the primary die. Satellite die may also be attached to the substrate in bare die or packaged form. A standoff is attached to the underside of the substrate to interface to a system board. The standoff may be different heights depending on how many packages are stacked together. The package has a cap with an upper surface that is configured to serve as a seating plane for the package above. The undersurface of the substrate is configured to serve as a seating plane for the package below. The packages are all stacked in a rotated manner such that the standoffs of each package can directly interface to the system board. The thermal buses of all the packages are tied into the system cooling. The power buses of all the packages are tied into the system power bus(es).

According to another aspect consistent with various embodiments a microprocessor package assembly includes microprocessor packages having an elongated substrate with a longitudinal axis and a microprocessor die mounted on the substrate. The microprocessor packages are connected to a system board through signal-carrying standoffs of variable height. The microprocessor packages are stacked on top of each other and rotated about an axis passing through the substrates of the microprocessor packages. The angular offset of the microprocessor packages provides a path around the substrate of one microprocessor package for the signal-carrying standoffs of a stacked microprocessor package to connect to the system board. The microprocessor packages may include a cap on top of the microprocessor package that is capable of receiving the bottom surface of the substrate of a stacked microprocessor package. The cap may be made of a thermally insulating material. The microprocessor package assembly may have an angular offset between the longitudinal axes of stacked microprocessor packages of at least 45 degrees. The axis of rotation of the longitudinal axes may pass vertically through the center of the substrates of the microprocessor packages. The microprocessor packages may have thermal buses that are separately thermally coupled to a system cooling apparatus. The thermal buses may extend from the microprocessor packages along the longitudinal axis of the microprocessor package substrates. The microprocessor packages may have power buses that are separately coupled to system power buses. The power buses may extend from the microprocessor packages along the longitudinal axis of the microprocessor package substrates.

According to another aspect consistent with various embodiments, a microprocessor package assembly includes microprocessor packages having microprocessor die on package substrates. The microprocessor packages may have power buses operable to provide power to the microprocessor die, and thermal buses operable to remove waste heat from the microprocessor die. A second microprocessor package is stacked vertically on top of a first microprocessor package. The power buses of the microprocessor packages are separately coupled to a system power supply. The thermal buses may be bonded to the backside of the microprocessor die. The thermal buses are separately thermally coupled to a system cooling apparatus. The microprocessor packages may have one or more satellite die on the package substrates. The thermal buses may be separated from the satellite die by an air gap. In alternate embodiments the thermal buses may be thermally coupled by a thermally conductive material to the satellite die. The first and second microprocessor packages may be separately coupled to a system board by signal-carrying standoffs.

According to another aspect consistent with various embodiments, a microprocessor package assembly includes a plurality of microprocessor packages, each microprocessor package having a microprocessor die mounted on an elongated substrate having a longitudinal axis, a power bus operable to provide power to the microprocessor die and a thermal bus operable to remove waste heat from the microprocessor die. The plurality of microprocessor packages are stacked on top of each other and rotated such that the longitudinal axis of each microprocessor package is offset by a rotation angle from a microprocessor package stacked lower in the microprocessor package assembly, and each microprocessor package has a separate electrical signal interface to a system board through a signal-carrying standoff. The microprocessor package assembly may include three microprocessor packages. The three microprocessor packages may each be offset by a rotation angle of 60 degrees. The microprocessor package assembly may include four microprocessor packages. The four microprocessor packages may each be offset by a rotation angle of 45 degrees.

BRIEF DESCRIPTION OF THE DRAWINGS

Embodiments of the present invention are illustrated in referenced figures of the drawings. It is intended that the embodiments and figures disclosed herein be considered illustrative rather than limiting.

DETAILED DESCRIPTION OF EXEMPLARY EMBODIMENTS

Figure 1:
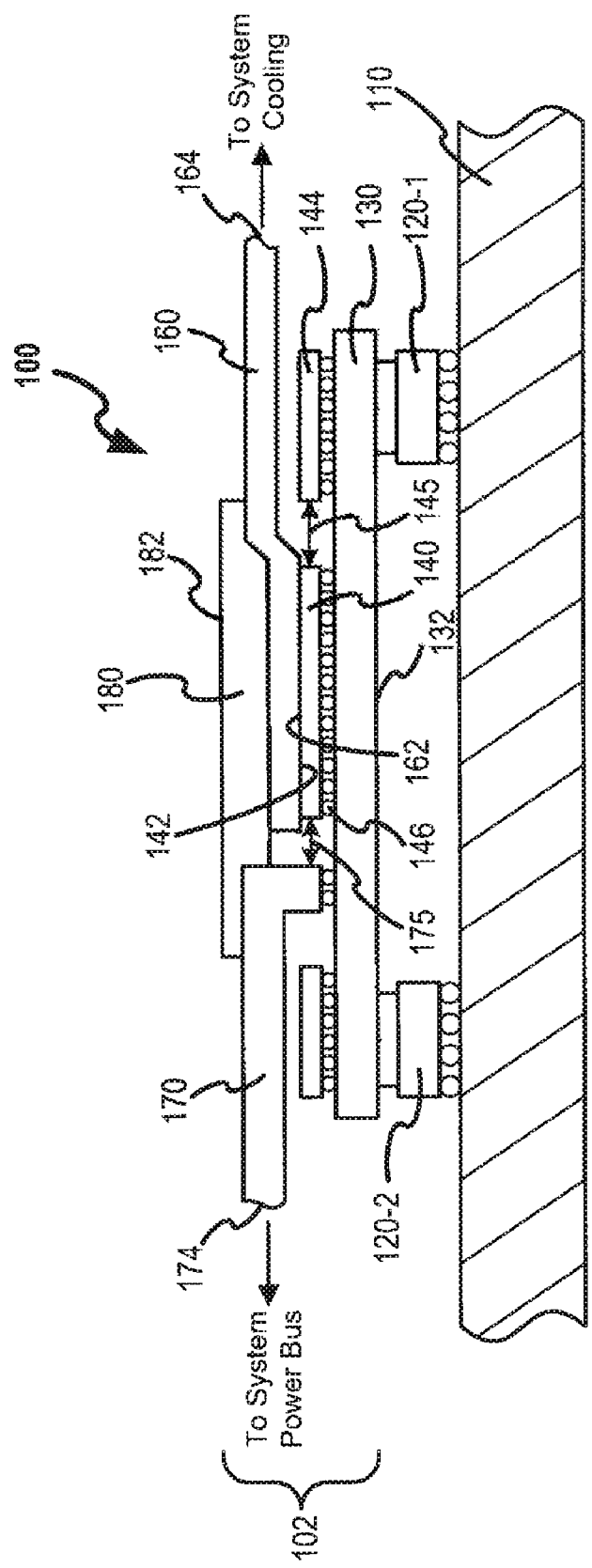
FIG. 1 shows a side view of a microprocessor package that may be employed in a microprocessor system according to various embodiments.

FIG. 1 shows a side view of an un-stacked or stand-alone microprocessor package 102 that may be employed in a microprocessor system 100 according to various embodiments of the present invention. Microprocessor package 102 includes substrate 130, microprocessor die 140, satellite die 144, thermal bus 160, power bus 170, and module cap 180. Substrate 130 provides mechanical support and electrical interconnection for components of the microprocessor package 102. Microprocessor die 140 may be any processing unit including a general purpose microprocessing unit with one or more central processing unit ("CPU") cores. Satellite die 144 may be a memory or other auxiliary component to microprocessor die 140. Thermal bus 160 removes waste heat from microprocessor package 102. Power bus 170 provides the power requirements of microprocessor die 140, satellite die 144, and other components of microprocessor package 102. Module cap 180 provides a mechanical interface between stacked microprocessor packages. Standoffs 120-1 and 120-2 electrically connect microprocessor package 102 to system board 110.

FIG. 1 shows only one microprocessor package 102 to illustrate the components of each microprocessor package in a stacked package assembly. However, embodiments of the present invention are directed to stacking microprocessor packages to increase system density in microprocessor systems. Microprocessor packages are stacked by placing the bottom resting plane 132 at the underside of the substrate 130 of one microprocessor package on the top resting plane 182 at the top surface of module cap 180 of another microprocessor package. Standoffs 120-1 and 120-2 carry electrical signals between package substrate 130 and system board 110. Standoffs 120-1 and 120-2 are of variable heights, allowing stacked packages to interconnect to the system board 110. The bottom microprocessor package in a stacked package assembly may be connected to system board 110 through standoffs 120-1 and 120-2 as illustrated in FIG. 1, or alternatively, standoffs 120-1 and 120-2 may be omitted for the bottom microprocessor package and the bottom microprocessor package may be directly connected to system board 110. Microprocessor package 102 may be used to create a stacked microprocessor package assembly that provides separate thermal and power interfaces for each microprocessor package in the assembly.

Substrate 130 of microprocessor package 102 may be a substrate or carrier suitable for mounting and interconnecting various integrated circuit components and discrete circuit components. For example, substrate 130 may be a printed circuit board (PCB) or a ceramic substrate. The various integrated circuit components on substrate 130 may include one or more microprocessor die 140 and one or more satellite die 144. The various discrete circuit components on substrate 130 may include resistors, diodes, inductors, and/or capacitors. The microprocessor die 140 and satellite die 144 are typically made according to an integrated circuit manufacturing process using semiconductor substrates. Microprocessor die 140 may include one or more CPU cores. Satellite die 144 may be a memory die such as static random access memory ("SRAM"), dynamic random access memory ("DRAM"), or synchronous dynamic random access memory ("SDRAM").

The microprocessor die 140 and satellite die 144 are mounted on substrate 130 using standard technologies for packaging and mounting integrated circuit components. For example, conventional integrated circuit packages include Pin Grid Array ("PGA"), Ball Grid Array ("BGA"), and thin-quad-flat-pack ("TQFP"). These integrated circuit packages may be mounted on a substrate using a through-hole technology or surface mount technology ("SMT"). Alternately, an integrated circuit die may be attached to a substrate in bare-die form using a flip-chip technology such as controlled collapse chip connect ("C4"). In a preferred embodiment, microprocessor die 140 is mounted as a bare die directly on substrate 130 using C4, as illustrated by C4 bump 146. Satellite die 144 may be mounted to substrate 130 using C4 or other flip-chip technology, or may be mounted using a conventional SMT carrier technology such as BGA or TQFP.

Thermal bus 160 includes surface 162 that is attached to back surface 142 of microprocessor die 140. Surface 162 may be attached to back surface 142 using any suitable method that provides high thermal conductivity through the interface between the two surfaces. For example, surface 162 of thermal bus 160 may be bonded to back surface 142 of microprocessor die 140 using a thermal adhesive such as a thermal epoxy. It will be appreciated that there are a variety of ways to provide a thermal connection between surface 162 of thermal bus 160 and back surface 142 of microprocessor die 140. For example, commercially available thermal adhesives may not provide adequate performance with respect to thermal conductivity or operating temperature range. Therefore, alternate embodiments may mechanically attach thermal bus 160 to substrate 130 for support and thermally attach surface 162 to back surface 142 of microprocessor die 140 using a thermal grease, thermal paste, or metallic thermal interface material.

Thermal bus 160 is connected at a thermal interface 164 to the system cooling to exchange the waste heat generated by microprocessor die 140. Thermal bus 160 may be constructed according to a number of commercially available technologies that provide a high lateral thermal conductivity. For example, thermal bus 160 may be a solid thermal conductor made out of one or more highly thermally conductive materials such as aluminum, copper, copper-tungsten, aluminum-silicon carbide, silicon-carbide, aluminum nitride, copper-diamond composite, silver-diamond composite, or silicon carbide-diamond composite. In other embodiments, thermal bus 160 may be a heat-pipe utilizing a working fluid to transfer heat laterally from microprocessor die 140 through thermal interface 164 to the system cooling. In yet other embodiments, a liquid cooling system may be used that circulates a coolant through conduits in thermal bus 160 to a heat exchanger in the system cooling.

One parameter of microprocessor system 100 is the die spacing 145 between microprocessor die 140 and satellite die 144. Reducing die spacing 145 provides for faster signaling between microprocessor die 140 and satellite die 144. For example, satellite die 144 may be a system memory die. Reducing the signal trace length between the microprocessor die 140 and the system memory die 144 will allow the memory bus speed to be increased, which will improve the overall microprocessor system speed. However, reducing die spacing 145 increases the system density around microprocessor die 140 and increases the need to remove waste heat from microprocessor die 140. Thermal bus 160 allows the waste heat to be effectively removed from microprocessor die 140 while allowing die spacing 145 to be minimized to increase the signal interface speed between microprocessor die 140 and satellite die 144.

Power bus 170 provides electrical power to microprocessor package 102 from the system power bus. Power bus 170 may be any suitable electrical conductor or assembly of conducting elements to provide power adequate for microprocessor package 102. Power bus 170 may be connected to substrate 130 using a suitable method including SMT, through-hole, or other module connection technologies. In various embodiments, power bus 170 is connected to substrate 130 close to microprocessor die 140. For example, distance 175 between power bus 170 and microprocessor die 140 may be minimized to provide for cleaner power distribution to the microprocessor die 140. In some embodiments, power bus 170 is connected directly to microprocessor die 140.

Figure 3:
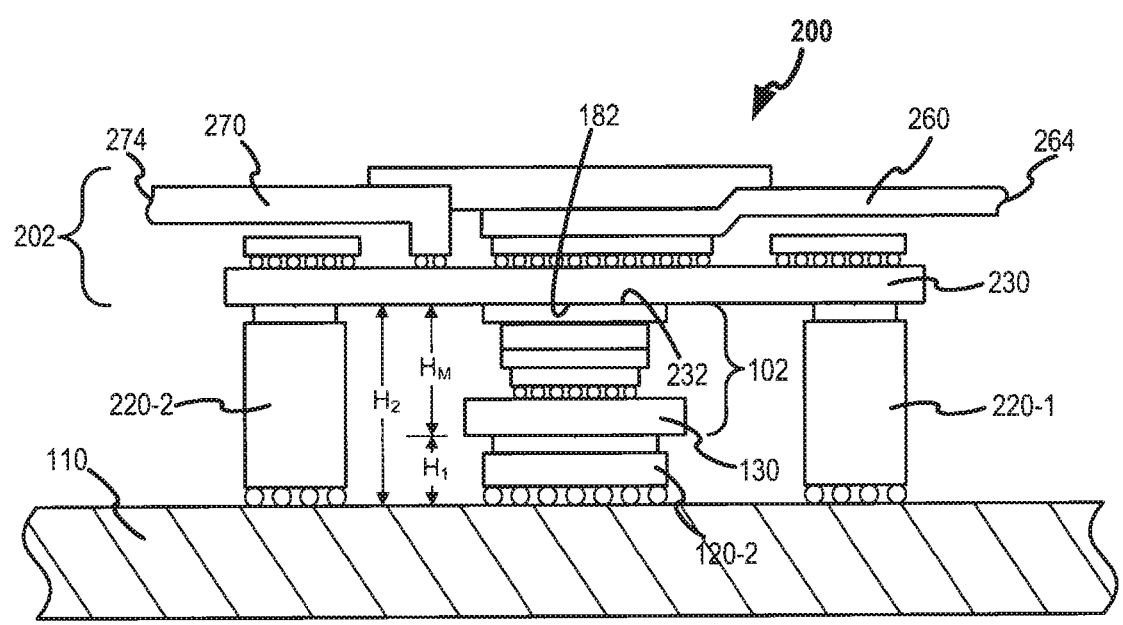
FIG. 3 shows a plan view of a microprocessor package assembly according to various embodiments.

Module cap 180 has a top seating plane 182 that serves as a resting plane or surface when other microprocessor packages are stacked on top of microprocessor package 102 (see FIG. 3). Module cap 180 functions to provide mechanical protection to the other components of the microprocessor package 102. Module cap 180 may also provide thermal isolation between stacked microprocessor packages. For example module cap 180 may be made of materials with a low thermal conductivity such as thermoplastic, various epoxies or polymers, kovar, and/or alumina. Alternatively, module cap 180 may be made of materials with a high thermal conductivity to provide for an additional heat removal path for microprocessor packages above and/or below microprocessor package 102 in a stacked package assembly.

Substrate 130 has a bottom seating plane 132 that serves as a resting plane or surface when microprocessor package 102 is stacked on top of other microprocessor packages (see FIG. 3). Bottom seating plane 132 is designed to rest on top of top seating plane 180 in various rotated configurations as described below.

Standoffs 120-1 and 120-2 have electrical signal carrying pathways that provide electrical interconnect from substrate 130 to system board 110. Standoffs 120-1 and 120-2 are connected to substrate 130 and system board 110 using solder bump technology or other suitable board-level interconnect technology. Standoffs 120-1 and 120-2 are designed to be easily manufactured in variable heights to connect microprocessor packages stacked in various configurations to system board 110.

Figure 2:
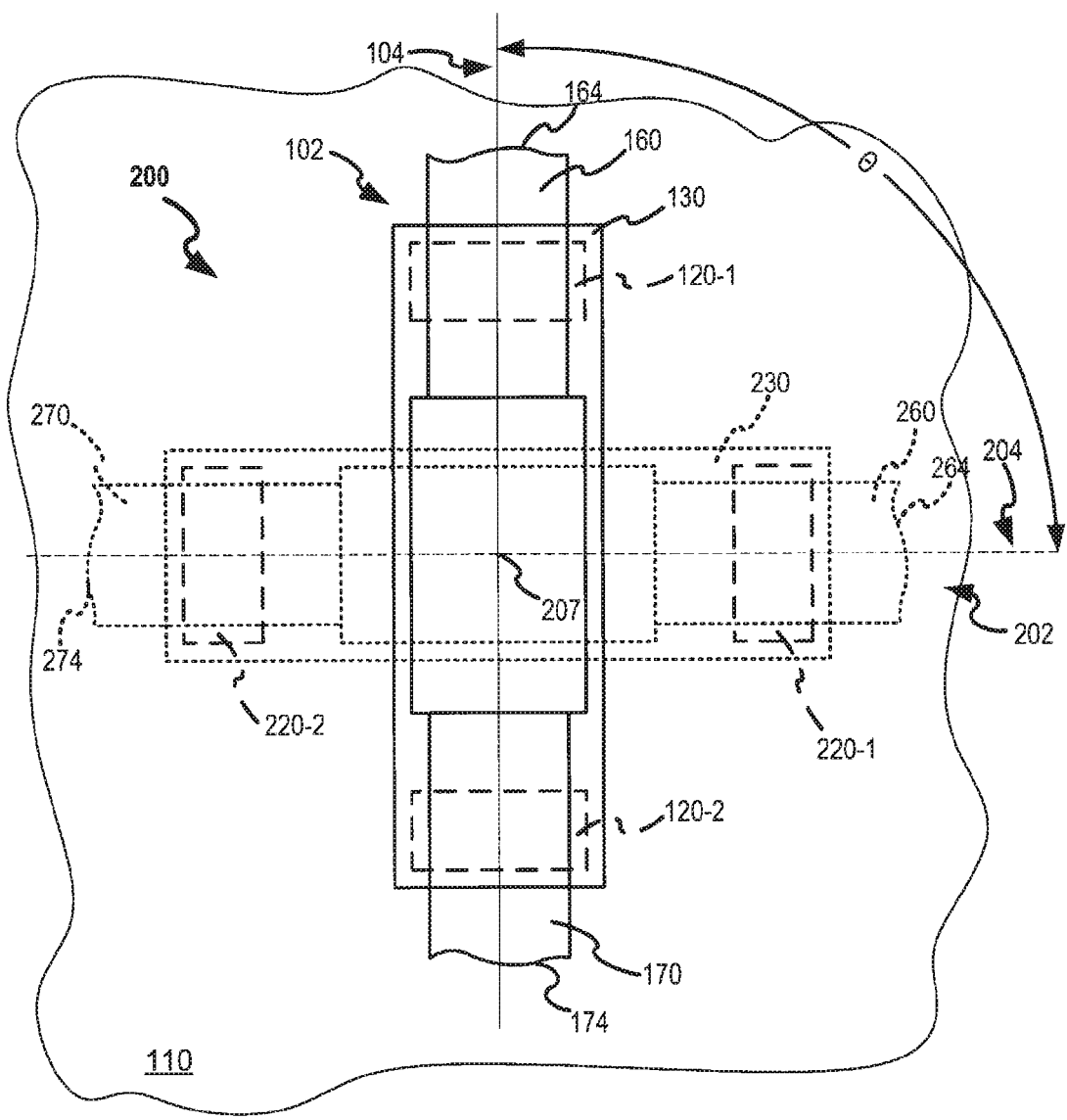
FIG. 2 shows a top view of a microprocessor package assembly according to various embodiments.

According to various embodiments, microprocessor packages may be stacked in an angularly rotated orientation to each other. For example, FIG. 2 shows a top view of microprocessor package assembly 200 with two stacked microprocessor packages. Microprocessor package assembly 200 includes a first microprocessor package 102 and a second microprocessor package 202 stacked on top of microprocessor package 102 but in a rotated orientation relative to microprocessor package 102. In FIG. 2, the dashed lines indicating the major components of microprocessor package 202 illustrate the arrangement of microprocessor package 202 relative to microprocessor package 102 and are not intended to illustrate hidden elements. Longitudinal axis 104 of the first microprocessor package 102 is illustrated as a line substantially parallel with the longer dimension of microprocessor package 102 (or of elongated substrate 130). Longitudinal axis 204 of the second microprocessor package 202 is also illustrated as a line substantially parallel with the longer dimension of the second microprocessor package 202 (or of elongated substrate 230). Microprocessor package 202 is stacked on top of microprocessor package 102 and offset by a rotation angle $\Theta$, as measured between the two longitudinal axes 104 and 204 about rotation axis 207. For a stacked microprocessor package assembly having two stacked microprocessor packages, the angle $\Theta$ may be 90 degrees. However, it will be appreciated that two microprocessor packages could be stacked with a rotation angle of other than 90 degrees. For example, rotation angle $\Theta$ may be substantially less than 90 degrees as long as the standoffs 220-1 and 220-2 of microprocessor package 202 can directly connect to system board 110 without being obstructed by substrate 130 of microprocessor package 102.

The stacked package architecture according to embodiments of the invention allows multiple microprocessors to be combined into one microprocessor package assembly in a high-density configuration while providing adequate power delivery and thermal regulation for each microprocessor package. For example, each microprocessor package of microprocessor package assembly 200 has its own separate power bus for providing power to the package, and thermal bus for removing waste heat from the package. Thermal bus 160 of microprocessor package 102 and thermal bus 260 of microprocessor package 202 may be connected to the system cooling separately through thermal interfaces 164 and 264, respectively. Therefore, the stacked architecture using microprocessor packages according to embodiments of the invention allows each microprocessor package to be thermally regulated independently of other microprocessor packages. Additionally, power bus 170 of microprocessor package 102 and power bus 270 of microprocessor package 202 may be connected to the system power separately through power interfaces 174 and 274, respectively. Accordingly, the power supply for each microprocessor package can be independent of the power supply for other microprocessor packages, which provides cleaner power and a more modular system design.

The variable height standoffs allow each microprocessor package to be connected independently to the system board. FIG. 3 shows a plan view of microprocessor package assembly 200 that illustrates how the microprocessor packages may be stacked in more detail. Bottom seating plane 232 of microprocessor package 202 rests on top of top seating plane 182 of microprocessor package 102. Standoffs 120-1 (not shown) and 120-2 connect substrate 130 of microprocessor package 102 to system board 110. Standoffs 220-1 and 220-2 are designed to be a height $H_2$ that is equal to the height $H_1$ of standoffs 120-1 and 120-2 plus one microprocessor package height $H_M$ such that they connect substrate 230 of microprocessor package 202 to system board 110 while substrate 230 is stacked on top of microprocessor package 102. If more microprocessor packages are stacked above microprocessor package 202, the standoffs will be longer by an additional height $H_M$ (assuming equal module/package heights).

Figure 4:
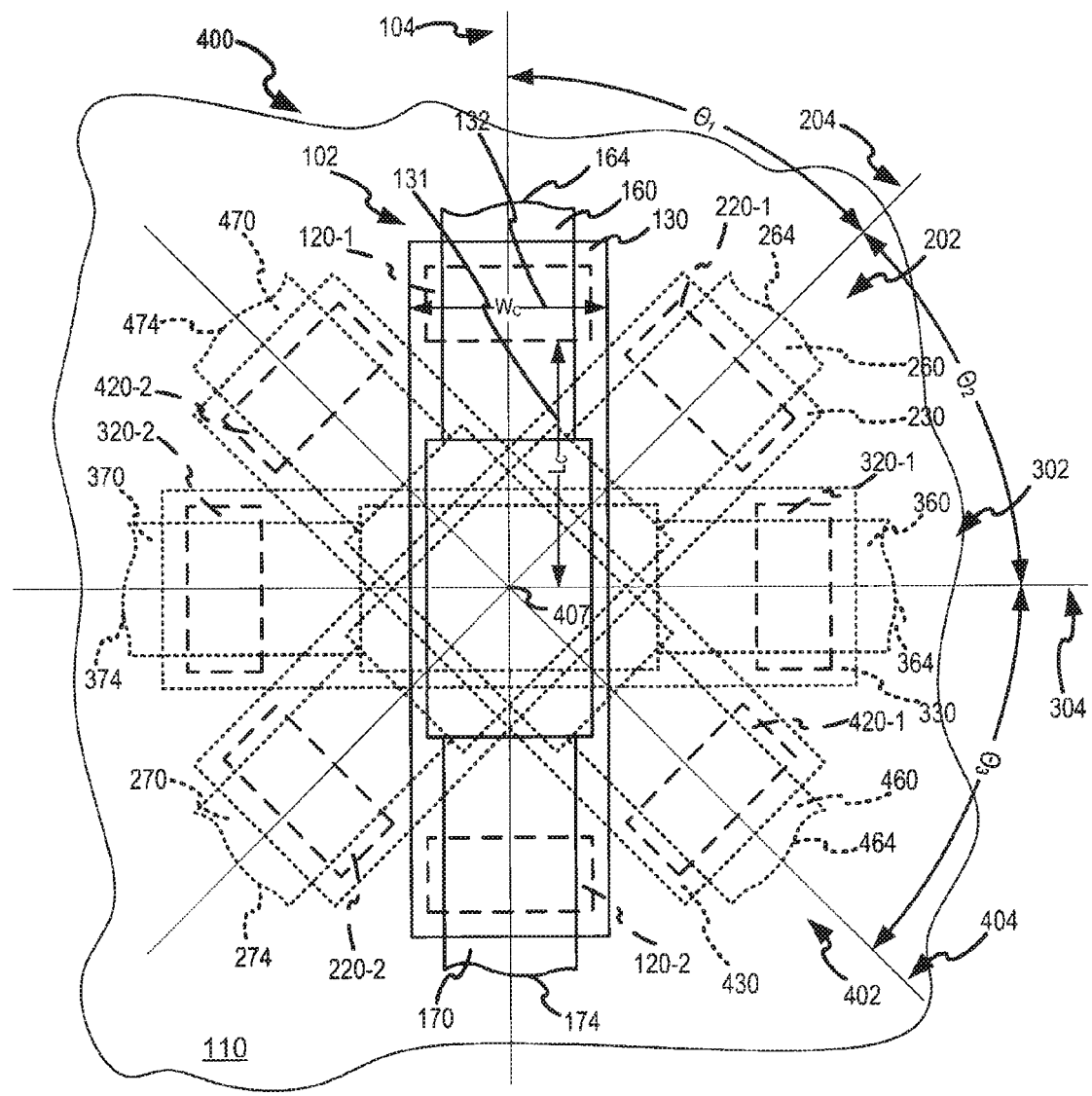
FIG. 4 shows a top view of a microprocessor package assembly according to various embodiments.

FIG. 4 is a top view of microprocessor package assembly 400 illustrating how multiple microprocessor packages may be stacked according to various embodiments. Microprocessor package assembly 400 includes microprocessor packages 102, 202, 302, and 402. In FIG. 4, microprocessor package 102 is represented by solid outlines of the major components including substrate 130, thermal bus 160, and power bus 170, while dashed lines indicate the position of standoffs 120-1 and 120-2. For clarity, microprocessor packages 202, 302, and 402 are shown by dashed lines to illustrate their relative positioning to microprocessor package 102 and not to indicate hidden elements. Longitudinal axis 104 of the microprocessor package 102 is illustrated as a line substantially parallel with the longer dimension of the elongated substrate 130 of microprocessor package 102. Longitudinal axes 204, 304, and 404 of microprocessor packages 202, 302, and 402, respectively, are also illustrated as lines substantially parallel with the longer dimension of their respective microprocessor package substrates. In the configuration of FIG. 4, microprocessor package 202 is stacked on top of microprocessor package 102 and offset by a rotation angle $\Theta_1$ between longitudinal axis 104 and longitudinal axis 204, as measured about rotation axis 407. Substrate 230 of microprocessor package 202 is connected to the system board through standoffs 220-1 and 220-2. Microprocessor package 302 is stacked on top of microprocessor package 202 and offset by a rotation angle $\Theta_2$ between longitudinal axis 204 and longitudinal axis 304, as measured about rotation axis 407. Substrate 330 of microprocessor package 302 is connected to the system board through standoffs 320-1 and 320-2. Microprocessor package 402 is stacked on top of microprocessor package 302 and offset by a rotation angle $\Theta_3$ between longitudinal axis 304 and longitudinal axis 404, as measured about rotation axis 407. Substrate 430 of microprocessor package 402 is connected to the system board through standoffs 420-1 and 420-2. In the embodiment of FIG. 4, rotation angles $\Theta_1$, $\Theta_2$, and $\Theta_3$ are equal to 45 degrees.

It will be appreciated that the choice of rotation angles depends on the number of microprocessor packages that are stacked in one microprocessor package assembly and the dimensions of each microprocessor package. For example, the length and width of the substrates may determine the minimum rotation angle for stacking microprocessor packages. The minimum rotation angle for stacking microprocessor packages in turn determines the number of microprocessor packages that may be stacked in one microprocessor package assembly. The minimum rotation angle $\Theta_1$ between microprocessor packages 102 and 202 may be determined by the length and width of substrates 130 and 230. For example, if substrates 130 and 230 have the same dimensions, an approximation of the minimum rotation angle may be given by the equation $2 \cdot \operatorname{atan}((\frac{1}{2} \cdot W_C)/L_C)$, where $W_C$ is the width 132 of the substrate 130 and $L_C$ is the length 131 of the substrate 130 from the middle to the inside of standoff carrier 120-1. However, the minimum rotation angle may be reduced if the standoffs 220-1 and 220-2 are narrower than substrate 230. Therefore, the stacked microprocessor package architecture according to various embodiments may be adapted to provide for a desired maximum number of microprocessor packages that may be stacked in one stacked microprocessor package assembly. The upper limit of microprocessor packages that may be stacked is determined by the size of the microprocessor die 140 and satellite die 144, and the area of the system board dedicated to the microprocessor package assembly 400.

Several advantages of the stacked package architecture using microprocessor package 102 may be appreciated with reference to FIG. 4. For example, each microprocessor package in the microprocessor package assembly 400 has a separate thermal interface and power interface from the other microprocessor packages. Accordingly, the thermal and power requirements may be determined at a microprocessor package level which eases the design process for the assembly. Additionally, each microprocessor package has a separate signal interconnection to the system board through the variable height standoffs such that each microprocessor package may be separately interconnected to the other system components. The modular design allows multiple microprocessor packages to be stacked using the same substrate design and only different height standoffs are required for the stacked package assembly.

In microprocessor package assembly 400, thermal busses 160, 260, 360, and 460 may be separately connected to the system cooling through thermal interfaces 164, 264, 364, and 464, respectively. In this way, waste heat may be removed from each microprocessor package separately, such that the waste heat generated by one microprocessor package of the stacked microprocessor package assembly 400 does not substantially affect the performance of the other microprocessor packages in the assembly.

Additionally, in microprocessor package assembly 400, power busses 170, 270, 370, and 470 may be separately connected to the system power through power interfaces 174, 274, 374, and 474, respectively. Therefore, the power requirements for each microprocessor package may be supplied separately, and the power usage of one microprocessor package in the microprocessor package assembly 400 does not substantially affect the power supply to the other microprocessor packages in the assembly.

As configured in FIG. 4, the thermal busses 160, 260, 360, and 460 are all on one side of microprocessor package assembly 400, while the power busses 170, 270, 370, and 470 are all on the other side of microprocessor package assembly 400. This may be advantageous because it may allow easier interconnection of the thermal and power busses to the system cooling and system power. For example, thermal busses 160, 260, 360, and 460 could all connect to one larger thermal bus at thermal interfaces 164, 264, 364, and 464, respectively. Similarly, power busses 170, 270, 370, and 470 could all connect to one larger power bus at power interfaces 174, 274, 374, and 474. In other embodiments, the thermal busses and power busses in microprocessor package assembly 400 could be alternated. For example, if microprocessor package rotation angles $\Theta_1$, $\Theta_2$, and $\Theta_3$ are equal to 225 degrees, the thermal busses and power busses for each microprocessor package would alternate. This may allow for greater separation of the thermal and power busses, which may provide advantages for various configurations.

Figure 5:
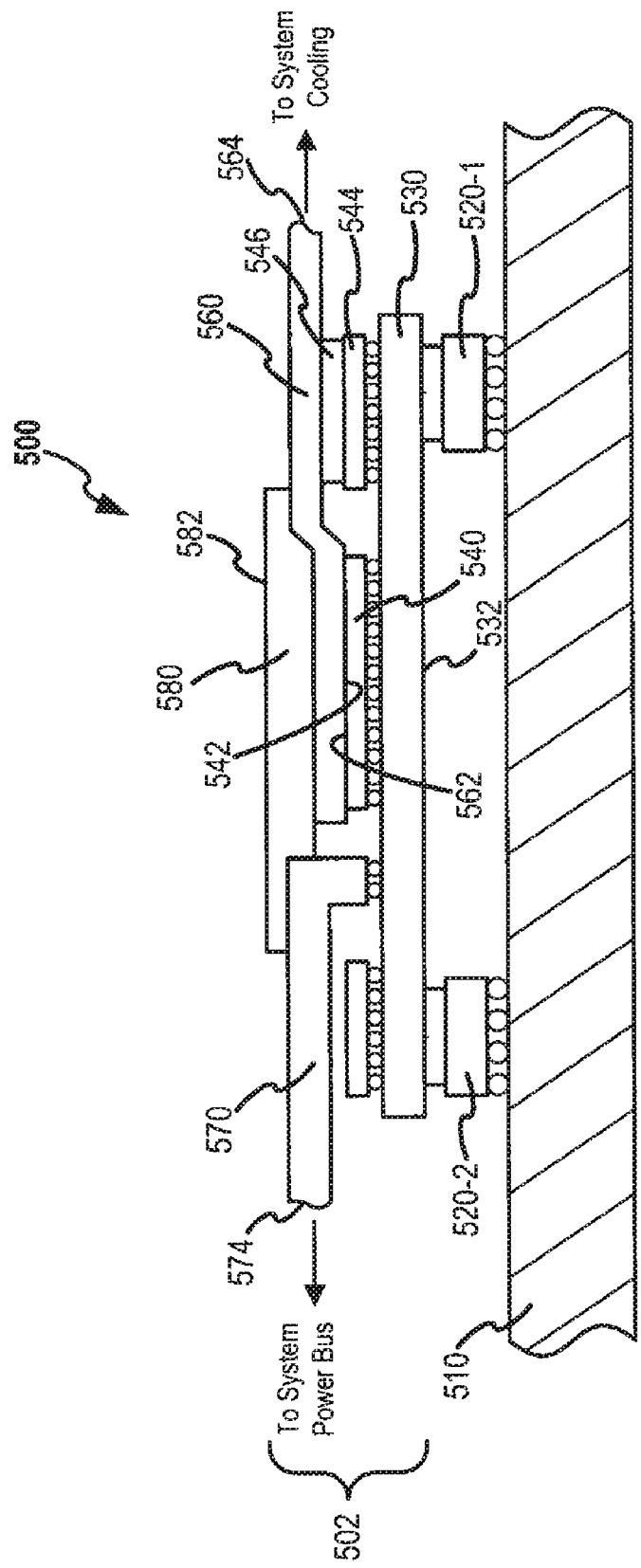
FIG. 5 shows a side view of a microprocessor package that may be employed in a microprocessor system.

FIG. 5 shows a side view of a microprocessor package 502 that may be employed in a microprocessor system 500 according to various embodiments. Microprocessor package 502 includes substrate 530, microprocessor die 540, thermal bus 560, power bus 570, and module cap 580. Substrate 530 is coupled to the system board 510 through standoffs 520-1 and 520-2. Surface 562 of thermal bus 560 is bonded to back surface 542 of microprocessor die 540. In this example, thermal bus 560 is thermally connected to satellite die 544 through thermal interface material 546. Thermal interface material 546 may be a thermally conductive adhesive, thermal paste, thermal grease, or thermal pad. Thermal bus 560 is connected to the system cooling at thermal interface 564. Power bus 570 is connected to system power at power interface 574. Microprocessor package 502 may be stacked by placing bottom seating plane 532 on top of top seating plane 582 of another microprocessor package 502 to create a stacked microprocessor package assembly on system board 510.

Figure 6A:
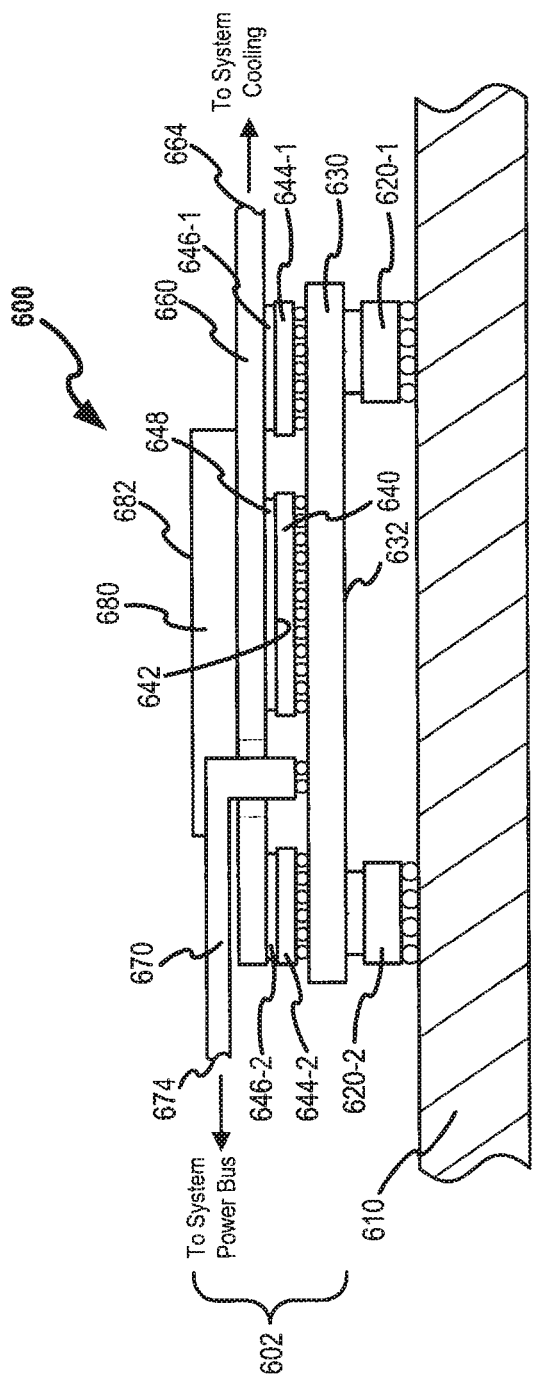
FIG. 6a shows a side view of a microprocessor package that may be employed in a microprocessor system according to various embodiments.

FIG. 6a shows a side view of a microprocessor package 602 that may be employed in a microprocessor system 600 according to various embodiments. Microprocessor package 602 includes substrate 630, microprocessor die 640, thermal bus 660, power bus 670, and module cap 680. In microprocessor package 602, thermal bus 660 is thermally connected to one or more of the satellite die 644-1 and 644-2 in addition to microprocessor die 640. Substrate 630 is coupled to the system board 610 through standoffs 620-1 and 620-2. Thermal bus 660 is thermally connected to microprocessor die 640 using thermal interface material 648. Thermal bus 660 is thermally connected to satellite die 644-1 and 644-2 using thermal interface material 646-1 and 646-2. Thermal interface materials 646-1, 646-2, and 648 may be a thermally conductive adhesive, thermal paste, thermal grease, thermal pad, or metallic thermal interface material. Thermal bus 660 is connected to the system cooling at thermal interface 664. Power bus 670 is connected to system power at power interface 674. Microprocessor package 602 may be stacked by placing bottom seating plane 632 on top of top seating plane 682 of another microprocessor package 602 to create a stacked microprocessor package assembly on system board 610.

Figure 6B:
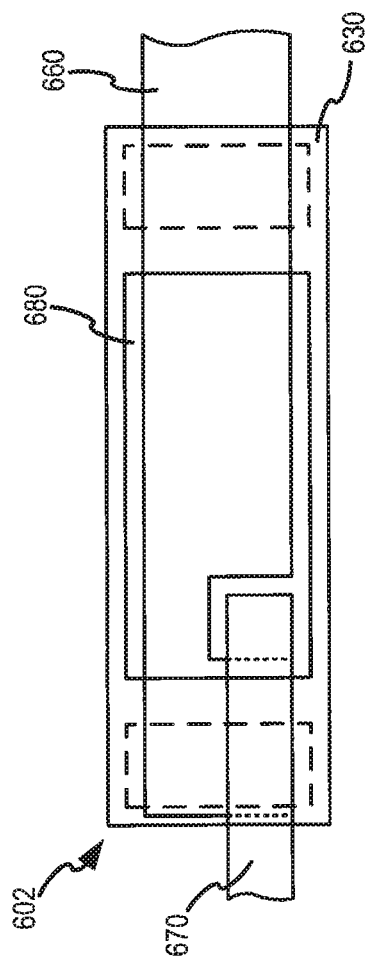
FIG. 6b shows a top-view of a microprocessor package that may be employed in a microprocessor system according to various embodiments.

FIG. 6b shows a top view of microprocessor package 602 according to various embodiments. In this example, thermal bus 660 covers the majority of the surface area of substrate 630, while power bus 670 drops through a notch in thermal bus 660 to contact substrate 630. A variety of other ways of connecting power bus 670 to substrate 630 are possible. For example, power bus 670 could extend to the same side as thermal bus 660, either along the sides of thermal bus 660 or above or below thermal bus 660.

The foregoing embodiments and accompanying description have been presented for purposes of illustration. While a number of exemplary aspects and embodiments have been discussed above, the description is not intended to limit embodiments of the present invention to the form disclosed herein. Those of skill in the art will recognize variations, modifications, additions, and sub-combinations thereof.

What is claimed is:

1. A microprocessor package assembly comprising:
a first microprocessor package having an elongated substrate with a first longitudinal axis and a first microprocessor die mounted on the substrate, the first microprocessor package connected to a system board through a first signal-carrying standoff having a first height; and
a second microprocessor package having an elongated substrate with a second longitudinal axis and a second microprocessor die mounted on the substrate, the second microprocessor package connected to the system board through a second signal-carrying standoff having a second height, the second height greater than the first height;
wherein the substrate of the second microprocessor package is rotated about an axis passing through the substrates of the first and the second microprocessor packages, the first and second longitudinal axes having an angular offset that provides a path around the substrate of the first microprocessor package for the second signal-carrying standoff to connect to the system board.

2. The microprocessor package assembly of claim 1, further comprising a first cap on top of the first microprocessor package, the first cap having a top surface for receiving a bottom surface of the substrate of the second microprocessor package, wherein the first cap comprises a thermally insulating material.

3. The microprocessor package assembly of claim 1, further comprising a first cap on top of the first microprocessor package, the first cap having a top surface for receiving a bottom surface of the substrate of the second microprocessor package, wherein the first cap comprises a thermally conducting material.

4. The microprocessor package assembly of claim 1, wherein the second longitudinal axis is offset from the first longitudinal axis by at least 45 degrees.

5. The microprocessor package assembly of claim 1, wherein the axis of rotation of the second microprocessor package passes vertically through the center of the substrates of the first and second microprocessor packages.

6. The microprocessor package assembly of claim 1, wherein the first microprocessor package has a first thermal bus and the second microprocessor package has a second thermal bus, the second thermal bus separately thermally coupled to a system cooling apparatus from the first thermal bus.

7. The microprocessor package assembly of claim 6, wherein the first thermal bus extends from the first microprocessor package along the first longitudinal axis and the second thermal bus extends from the second microprocessor package along the second longitudinal axis.

8. The microprocessor package assembly of claim 1, wherein the first microprocessor package has a first power bus and the second microprocessor package has a second power bus, the second power bus separately coupled to a system power bus from the first power bus.

9. The microprocessor package assembly of claim 8, wherein the first power bus extends from the first microprocessor package along the first longitudinal axis and the second power bus extends from the second microprocessor package along the second longitudinal axis.

10. A microprocessor package assembly comprising:
a first microprocessor package having a first microprocessor die on a first substrate, the first microprocessor package including a first power bus operable to provide power to the first microprocessor die and a first thermal bus operable to remove waste heat from the first microprocessor die; and
a second microprocessor package having a second microprocessor die on a second substrate, the second microprocessor including a second power bus operable to provide power to the second microprocessor die and a second thermal bus operable to remove waste heat from the second microprocessor die, the second microprocessor package stacked vertically on top of the first microprocessor package,
wherein the first power bus and the second power bus are separately coupled to a system power supply, and wherein the first thermal bus and the second thermal bus are separately thermally coupled to a system cooling apparatus.

11. The microprocessor package assembly of claim 10, wherein the first microprocessor package is coupled to a system board by a first signal-carrying standoff and the second microprocessor package is coupled to the system board by a second signal-carrying standoff, the second signal-carrying standoff coupled to the system board without being directly coupled to the first microprocessor package.

12. The microprocessor package assembly of claim 10, wherein the first thermal bus is bonded to a back surface of the first microprocessor die and the second thermal bus is bonded to a back surface of the second microprocessor die.

13. The microprocessor package assembly of claim 10, further comprising a first satellite die mounted on the first substrate and a second satellite die mounted on the second substrate.

14. The microprocessor package assembly of claim 13, wherein the first thermal bus is separated from the first satellite die by a first air gap and the second thermal bus is separated from the second satellite die by a second air gap.

15. The microprocessor package assembly of claim 13, wherein the first thermal bus is thermally coupled by a thermally conductive material to the first satellite die and the second thermal bus is thermally coupled by a thermally conductive material to the second satellite die.

16. A microprocessor package assembly comprising:
   a plurality of microprocessor packages, each microprocessor package including a microprocessor die mounted on an elongated substrate having a longitudinal axis, a power bus operable to provide power to the microprocessor die and a thermal bus operable to remove waste heat from the microprocessor die,
   wherein the plurality of microprocessor packages are stacked on top of each other and rotated such that the longitudinal axis of each microprocessor package is offset by a rotation angle from a microprocessor package stacked lower in the microprocessor package assembly, and wherein each microprocessor package has a separate electrical signal interface to a system board through a signal-carrying standoff.

17. The microprocessor package assembly of claim 16, wherein the microprocessor package assembly comprises three microprocessor packages.

18. The microprocessor package assembly of claim 17, wherein the rotation angle between microprocessor packages in the microprocessor package assembly is 60 degrees.

19. The microprocessor package assembly of claim 16, wherein the microprocessor package assembly comprises four microprocessor packages.

20. The microprocessor package assembly of claim 19, wherein the rotation angle between microprocessor packages in the microprocessor package assembly is 45 degrees.

\* \* \* \* \*